(12) United States Patent
Shin et al.

(10) Patent No.: US 7,573,411 B2
(45) Date of Patent: Aug. 11, 2009

(54) DIGITAL-TO-ANALOG CONVERTER, DISPLAY PANEL DRIVER HAVING THE SAME, AND DIGITAL-TO-ANALOG CONVERTING METHOD

(75) Inventors: Yun-seung Shin, Seoul (KR); Ju-hyun Ko, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/007,333

(22) Filed: Jan. 9, 2008

(65) Prior Publication Data
US 2008/0191912 A1 Aug. 14, 2008

(30) Foreign Application Priority Data
Feb. 9, 2007 (KR) .................... 10-2007-0013800

(51) Int. Cl.
*H03M 1/68* (2006.01)
*G09G 5/10* (2006.01)
(52) U.S. Cl. .................... 341/145; 341/144; 345/692
(58) Field of Classification Search ................ 341/144, 341/145, 154; 345/204, 208, 209, 690, 691–693
See application file for complete search history.

(56) References Cited

U.S. PATENT DOCUMENTS

| | | | |
|---|---|---|---|
| 5,650,796 A | 7/1997 | Owaki et al. | |
| 7,236,114 B2 | 6/2007 | Ahn | |
| 7,453,386 B2 * | 11/2008 | Jeon et al. | 341/145 |
| 2003/0201959 A1 | 10/2003 | Sakaguchi | |
| 2006/0017680 A1 * | 1/2006 | Chen et al. | 345/96 |
| 2006/0050037 A1 | 3/2006 | Maki | |
| 2006/0244521 A1 * | 11/2006 | Yoshida et al. | 330/9 |
| 2008/0024478 A1 * | 1/2008 | Yoshioka et al. | 345/210 |
| 2008/0030489 A1 * | 2/2008 | Kim et al. | 345/205 |
| 2008/0084409 A1 * | 4/2008 | Rao | 345/209 |
| 2008/0150779 A1 * | 6/2008 | Sung | 341/145 |

FOREIGN PATENT DOCUMENTS

| | | | |
|---|---|---|---|
| JP | 05252032 A | * | 9/1993 |
| JP | 07-128638 | | 5/1995 |
| KR | 10-2003-0084728 | | 11/2003 |
| KR | 10-2006-0050969 | | 5/2006 |
| KR | 10-2006-0066417 | | 6/2006 |

* cited by examiner

*Primary Examiner*—Howard Williams
(74) *Attorney, Agent, or Firm*—Lee & Morse, P.C.

(57) ABSTRACT

A digital-to-analog converter outputting an analog data voltage corresponding to n-bit data, includes a chopping amplification unit adapted to receive an upper bit voltage corresponding to upper x bits of the n-bit data and a lower bit voltage corresponding to lower y bits of the n-bit data and to output the analog data voltage. The chopping amplification unit may include a sample and hold capacitor adapted to be charged with the upper bit voltage in a non-inverting mode, and a chopping amplifier adapted to supply the upper bit voltage to the sample and hold capacitor in the non-inverting mode and adapted to output a voltage corresponding to the sum of the upper bit voltage and the lower bit voltage as the analog data voltage in an inverting mode.

23 Claims, 7 Drawing Sheets

US 7,573,411 B2

DIGITAL-TO-ANALOG CONVERTER, DISPLAY PANEL DRIVER HAVING THE SAME, AND DIGITAL-TO-ANALOG CONVERTING METHOD

BACKGROUND OF THE INVENTION

1. Field of the Invention

Example embodiments relate to a digital-to-analog converter (DAC), a display panel driver having the same, and a method for digital-to-analog conversion. More particularly, example embodiments relate to a DAC having a reduced chip size, a display panel driver having the same, and a method for digital-to-analog conversion.

2. Description of the Related Art

Generally, display devices may require a digital-to-analog converter DAC in order to display images corresponding to input digital data. The DAC may convert digital data into an analog data voltage and may apply the analog data voltage to a display panel so that an image corresponding to the digital data may be displayed on the display panel.

As a number of bits of digital data increases, a higher resolution of an image corresponding to the digital data is produced. However, the display device may require a component (or device) capable of processing digital data having a large number of bits in order to display the high-resolution image. That is, when the number of digital data bits is increased in order to display the high-resolution image, a chip size of the DAC included in the display device may be large, i.e., when the number of bits of digital data is increased by m, the chip size of a DAC processing the digital data may increase by approximately $2^m$. To meet the high integration of semiconductor chips, a variety of methods for reducing the chip size of a DAC has been developed. Yet, modern semiconductor technology still requires further advances in DACs to reduce the chip size.

SUMMARY OF THE INVENTION

Example embodiments are therefore directed to a DAC, which substantially overcome one or more of the problems due to the limitations and disadvantages of the related art.

It is therefore a feature of example embodiments to provide a display panel including a DAC.

It is therefore another feature of example embodiments to provide a DAC with reduced chip size.

It is therefore another feature of example embodiments to provide a DAC with low power consumption.

It is therefore another feature of example embodiments to provide a method for digital-to-analog conversion.

At least one of the above and other features of example embodiments may provide a digital-to-analog converter outputting an analog data voltage corresponding to n-bit data, including a chopping amplification unit adapted to receive an upper bit voltage corresponding to upper x bits of the n-bit data and a lower bit voltage corresponding to lower y bits of the n-bit data and outputting the analog data voltage. The chopping amplification unit may include a sample and hold capacitor adapted to be charged with the upper bit voltage in a non-inverting mode, and a chopping amplifier adapted to supply the upper bit voltage to the sample and hold capacitor in the non-inverting mode and adapted to output a voltage corresponding to a sum of the upper bit voltage and the lower bit voltage as the analog data voltage in an inverting mode.

The chopping amplifier may include a first input terminal adapted to receive the upper bit voltage in the non-inverting mode, a second input terminal connected to a first terminal of the sample and hold capacitor, and an output terminal adapted to output the analog data voltage in the inverting mode. The chopping amplifier may alternately operate in the non-inverting mode and the inverting mode.

In the non-inverting mode, the first input terminal may be a positive terminal and the second input terminal may be a negative terminal. In the inverting mode, the first input terminal is a negative terminal and the second input terminal is a positive terminal.

The digital-to-analog converter may further include an upper bit switch adapted to transfer the upper bit voltage to the first input terminal of the chopping amplifier, a lower bit switch adapted to transfer the lower bit voltage or a reference voltage to a second terminal of the sample and hold capacitor, a first feedback switch adapted to connect the first input terminal to the output terminal of the chopping amplifier, and a second feedback switch adapted to connect the second input terminal to the output terminal of the chopping amplifier.

The upper bit switch may be turned on in the non-inverting mode and turned off in the inverting mode. The lower bit switch may be adapted to transfer the reference voltage in the non-inverting mode and transfers the lower bit voltage in the inverting mode.

The first feedback switch may be turned off in the non-inverting mode and turned on in the inverting mode. The second feedback switch may be turned on in the non-inverting mode and turned off in the inverting mode.

The second terminal of the sample and hold capacitor may be adapted to have a voltage corresponding to the lower bit voltage, and the first terminal of the sample and hold capacitor may be adapted to have a voltage corresponding to the sum of the upper bit voltage and the lower bit voltage in the inverting mode.

The digital-to-analog converter may further include an upper bit decoder adapted to output a high level voltage corresponding to the upper x bits among a plurality of high level voltages input thereto as the upper bit voltage, and a lower bit decoder adapted to output a low level voltage corresponding to the lower y bits among a plurality of low level voltages input thereto as the low bit voltage.

The digital-to-analog converter may further include a high level voltage generator adapted to divide a voltage difference between a first high reference voltage and a second high reference voltage to generate the plurality of high level voltages, and a low level voltage generator adapted to divide a voltage difference between a first low reference voltage and a second low reference voltage to generate the plurality of low level voltages. The high level voltage generator may include a resistor string including x resistors, and the low level voltage generator may include a resistor string including y resistors. The second high reference voltage may be equal to the second low reference voltage.

One line period of a display panel scanning operation may be divided into a non-inverting mode period and an inverting mode period. The one line period of the display panel scanning operation may include a first period in which the display panel driver is adapted to operate in the non-inverting mode, and a second period in which the display panel driver may be adapted to operate in the inverting mode.

At least one of the above and other features of example embodiments may provide a digital-to-analog converting method for converting n-bit data into an analog data voltage. The method may include providing a sample and hold capacitor and a chopping amplifier alternately operating in a non-inverting mode and an inverting mode, generating an upper bit voltage corresponding to upper x bits of the n-bit data and a lower bit voltage corresponding to lower y bits of the n-bit data, receiving the upper bit voltage through a first input terminal of the chopping amplifier and charging the sample and hold capacitor having a first terminal connected to a second input terminal of the chopping amplifier with the upper bit voltage in the non-inverting mode, and supplying the lower bit voltage to a second terminal of the sample and hold capacitor and connecting an output terminal of the chopping amplifier to the first input terminal of the chopping amplifier to output a voltage corresponding to the sum of the upper bit voltage and the lower bit voltage as the analog data voltage in the inverting mode.

The voltage of the second terminal of the sample and hold capacitor may correspond to a reference voltage, and the voltage of the first terminal of the sample and hold capacitor may correspond to the upper bit voltage in the non-inverting mode. The voltage of the second terminal of the sample and hold capacitor may correspond to the lower bit voltage, and the voltage of the first terminal of the sample and hold capacitor may correspond to the sum of the upper bit voltage and the lower bit voltage in the inverting mode.

The offset of the chopping amplifier may be removed by alternately operating the chopping amplifier in the non-inverting mode and the inverting mode.

The upper bit voltage may be a high level voltage corresponding to the upper x bits of a plurality of high level voltages generated by dividing a voltage difference between a first high reference voltage and a second high reference voltage. The lower bit voltage may be a low level voltage corresponding to the lower y bits of a plurality of low level voltages generated by dividing a voltage difference between a first low reference voltage and a second low reference voltage.

BRIEF DESCRIPTION OF THE DRAWINGS

The above and other features and advantages of the example embodiments will become more apparent to those of ordinary skill in the art by describing in detail example embodiments thereof with reference to the attached drawings, in which.

DETAILED DESCRIPTION OF THE INVENTION

Korean Patent Application No. 10-2007-0013800, filed on Feb. 9, 2007, in the Korean Intellectual Property Office, and entitled: "Digital-to-Analog Converter, Display Panel Driver Having the Same, and Digital-to-Analog Converting Method," is incorporated by reference herein in its entirety.

Example embodiments will now be described more fully hereinafter with reference to the accompanying drawings. The invention may, however, be embodied in different forms and should not be construed as limited to the embodiments set forth herein. Rather, these example embodiments are provided so that this disclosure will be thorough and complete, and will fully convey the scope of the invention to those skilled in the art.

Figure 1:
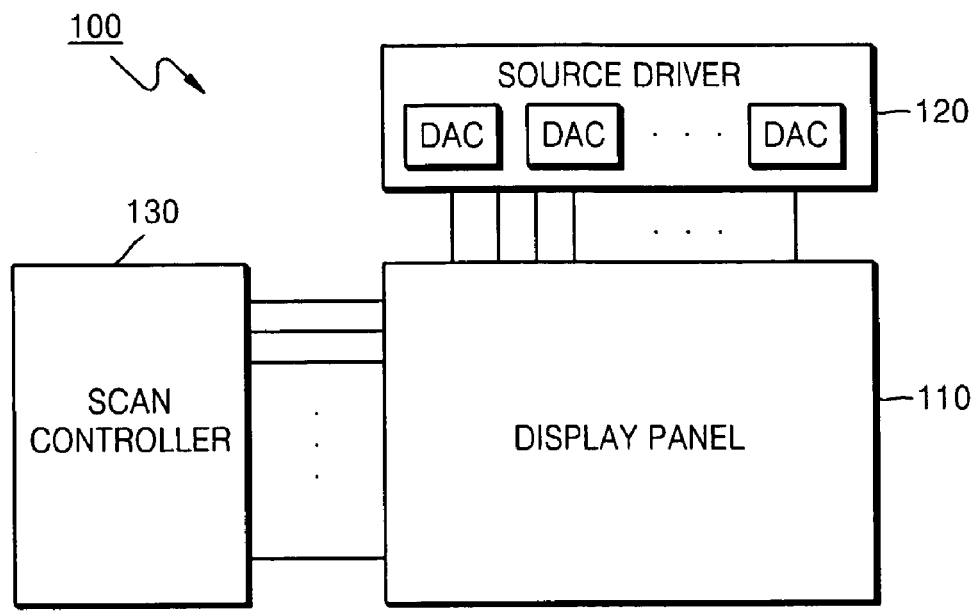
FIG. 1 illustrates a block diagram of a display device.

FIG. 1 illustrates a typical block diagram of a display device 100. Referring to FIG. 1, the display device 100 may include a display panel 110, a source driver 120 having a plurality of digital-to-analog converters (DACs), and a scan controller 130. The DAC may be employed as a resistor string converter employing a resistor string, a capacitor converter employing charging and charge distribution of a capacitor, or a converter having a combination of the configurations of the resistor string converter and the capacitor converter.

Figure 2:
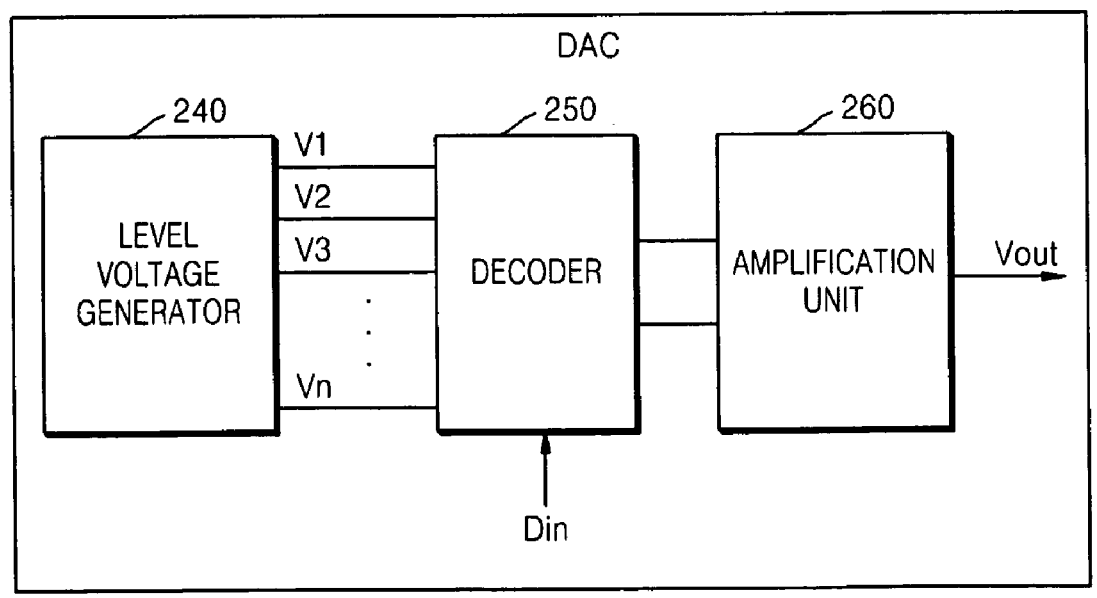
FIG. 2 illustrates a block diagram of a digital-to-analog converter DAC shown in FIG. 1.

FIG. 2 illustrates a block diagram of a DAC of FIG. 1. Referring to FIG. 2, the DAC may include a level voltage generator 240, a decoder 250, and an amplification unit 260. The level voltage generator 240 may generate level voltages V1 through Vn and may output the level voltages V1 through Vn to the decoder 250. The decoder 250 may output a level voltage corresponding to digital data Din. The amplification unit 260 may amplify, buffer, and/or sample and hold the level voltage output from the decoder 250, and may output the amplified, buffered, and/or sampled and held voltage as an analog data voltage Vout.

Figure 3:
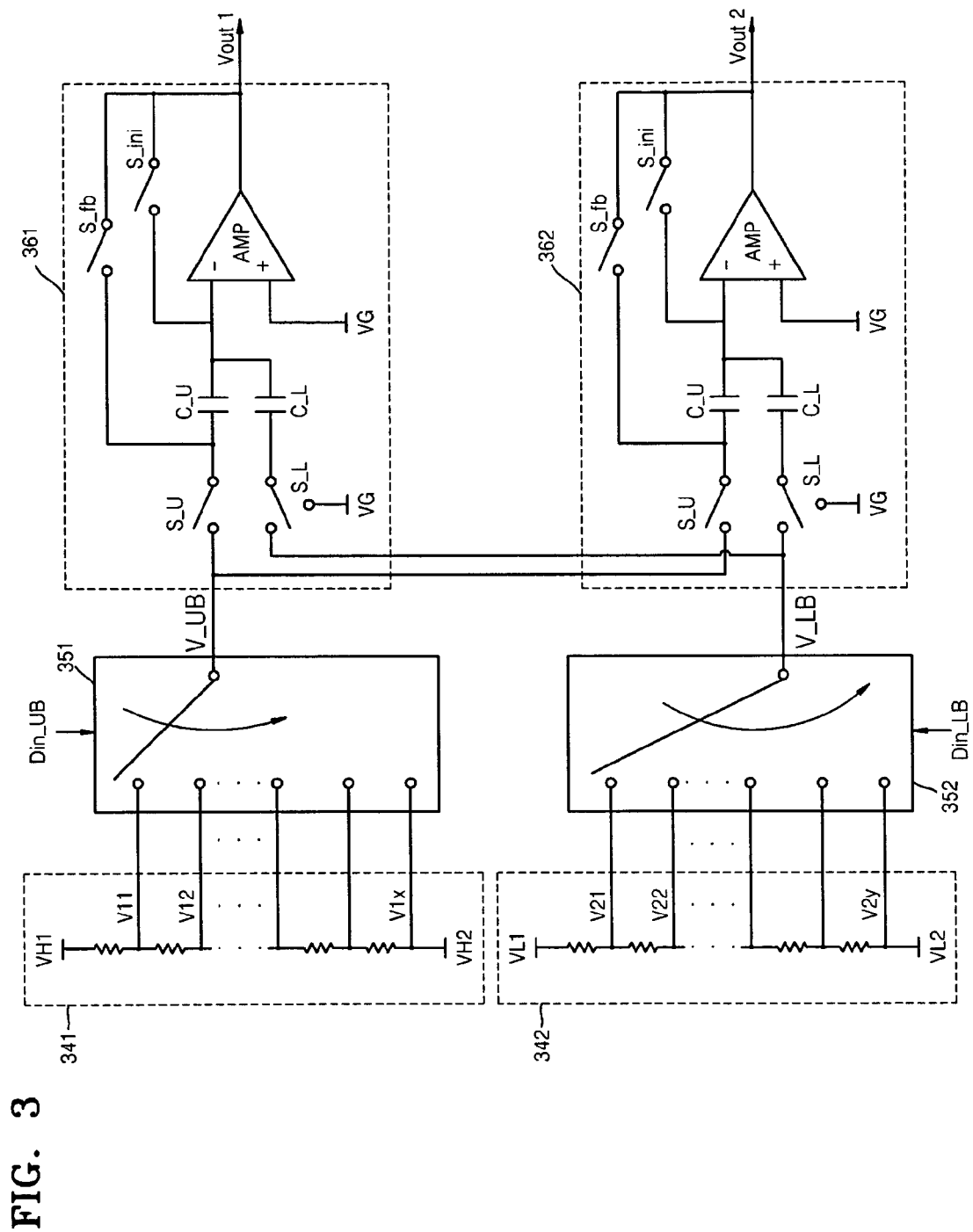
FIG. 3 illustrates a configuration of a DAC having two amplification units.

FIG. 3 illustrates a configuration of a DAC including two amplification units. Referring to FIG. 3, the DAC may include a high level voltage generator 341, a low level voltage generator 342, an upper bit decoder 351, a lower bit decoder 352, a first amplification unit 361, and a second amplification unit 362.

The high level voltage generator 341 may divide a voltage difference between a first high reference voltage VH1 and a second high reference voltage VH2 to generate a plurality of high level voltages V11, V12 ... V1x. The low level voltage generator 342 may divide a voltage difference between a first low reference voltage VL1 and a second low reference voltage VL2 to generate a plurality of low level voltages V21, V22 ... V2y.

Digital data input to the DAC of FIG. 3 may be divided into upper x bits Din_UB and lower y bits Din_LB, and may be respectively applied to the upper bit decoder 351 and the lower bit decoder 352. The upper bit decoder 351 may output a high level voltage corresponding to the upper x bits Din_UB among the plurality of high level voltages V11, V12 ... V1x as an upper bit voltage V_UB. The lower bit decoder 352 may output a low level voltage corresponding to the lower y bits Din_LB among the low level voltages V11, V12 .... V1x as a lower bit voltage V_LB.

When n-bit data is converted into an analog data voltage, the DAC using the two level voltage generators 341 and 342 may each include $2^{n/2}$ resistors, such that the two $2^{n/2}$-to-1 decoders 351 and 352, as illustrated in FIG. 3, requires a chip size smaller than that of a DAC using a single level voltage generator having $2^n$ resistors and a single $2^n$-to-1 decoder. The DAC illustrated in FIG. 3 may have reduced chip size. In FIG. 3, x and y may be equal and may be set to n/2.

Each of the first and second amplification units 361 and 362 may include an amplifier AMP, an upper capacitor C_U, a lower capacitor C_L, an upper switch S_U, a lower switch S_L, a feedback switch S_fb and an initialization switch S_ini. The operation of the DAC illustrated in FIG. 3 will now be explained with reference to FIG. 4.

Figure 4:
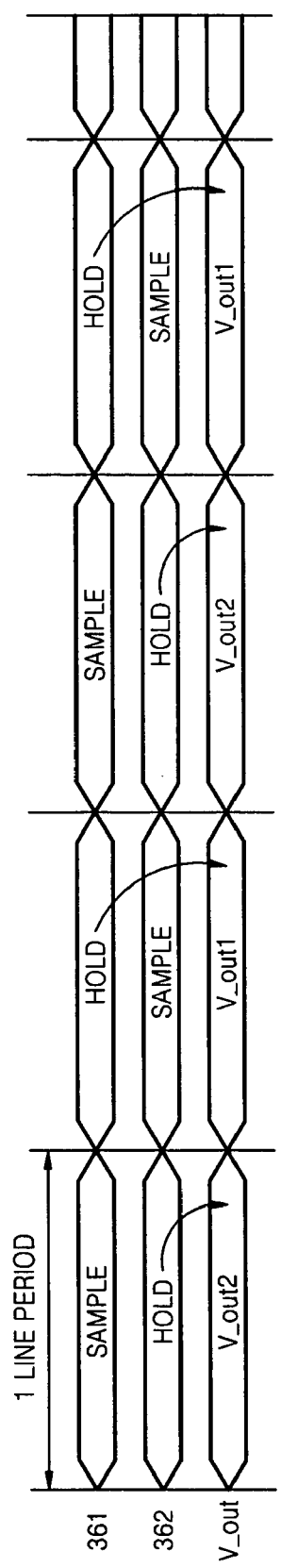
FIG. 4 illustrates a timing diagram of an operation of the DAC of FIG. 3.

FIG. 4 illustrates a timing diagram of operating the DAC of FIG. 3. In FIG. 4, one line period may be considered as a period during which a single gate line of a display panel may be scanned.

In a first line period, the upper capacitor C_U of the first amplification unit amplifier 361 operating in a sample mode may be charged with the upper bit voltage V_UB, and the second amplification unit 362 operating in a hold mode may output an analog data voltage V_out2 corresponding to a sum of the upper bit voltage V_UB and the lower bit voltage V_LB.

In a second line period, the upper capacitor C_U of the second amplification unit 362 operating in the sample mode may be charged with the upper bit voltage V_UB, and the first amplification unit 361 operating in the hold mode may output an analog data voltage V_out1 corresponding to a sum of the upper bit voltage V_UB and the lower bit voltage V_LB.

As illustrated in FIG. 4, the sample mode and the hold mode may be alternately repeated in third and fourth line periods, i.e., the first amplification unit 361 and the second amplification unit 362 may alternately repeat the sample mode and the hold mode in the DAC. Further, each of the first and second amplification units 361 and 362 may not both operate in the sample mode and the hold mode during one line period, which may require the DAC having two amplification units 361 and 362, as illustrated in FIG. 3. However, because the DAC as shown in FIG. 3 may require two amplification units, it may increase the chip size of the DAC.

Accordingly, in order to reduce the chip size in the DAC, a single chopping amplification unit 560 may be used in accordance to example embodiments. The DAC according to example embodiments will now be explained with reference to FIGS. 5A-5C and 6.

Figure 5A:
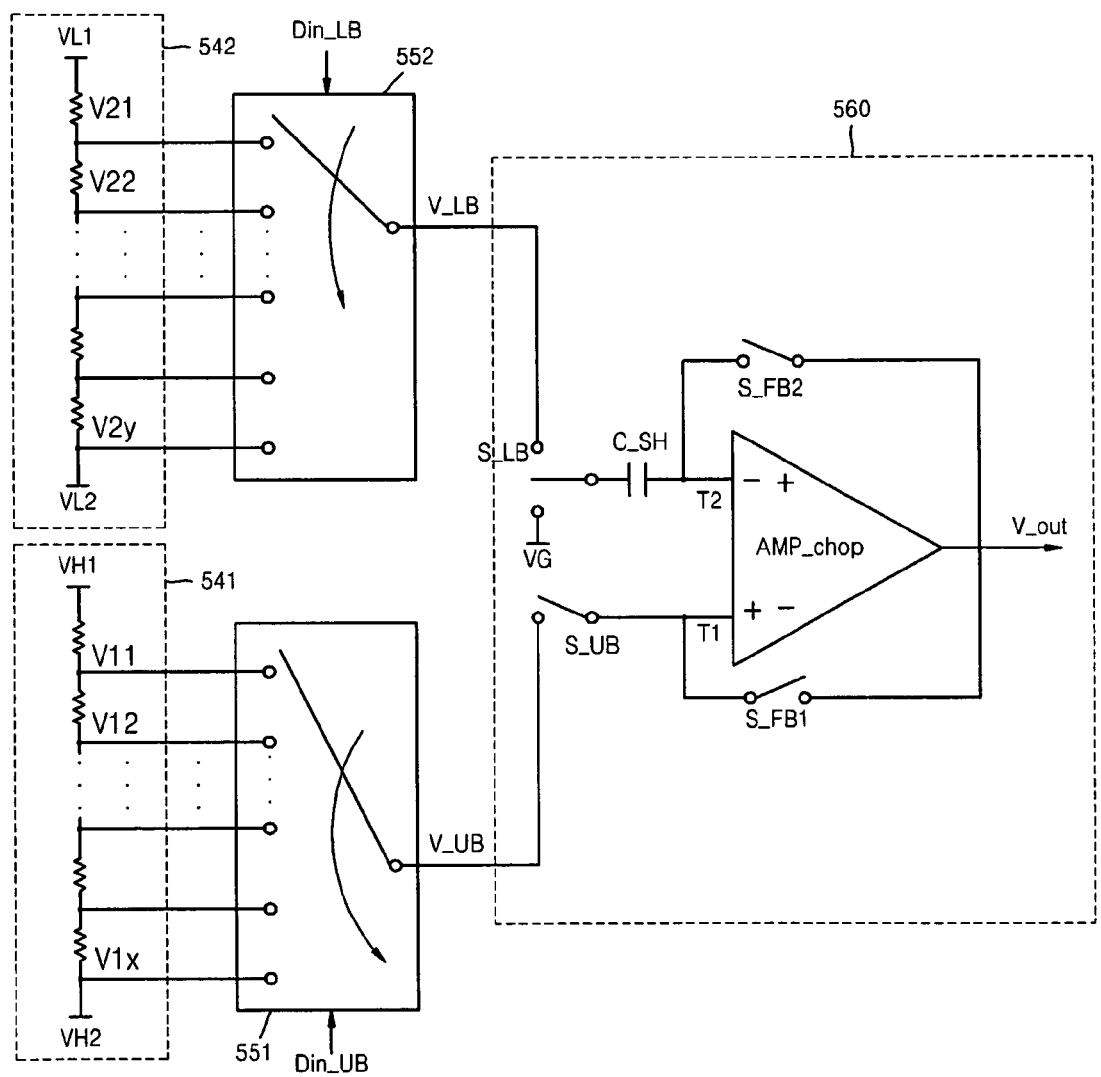
FIG. 5A illustrates a configuration of a DAC according to an example embodiment.
Figure 5B:
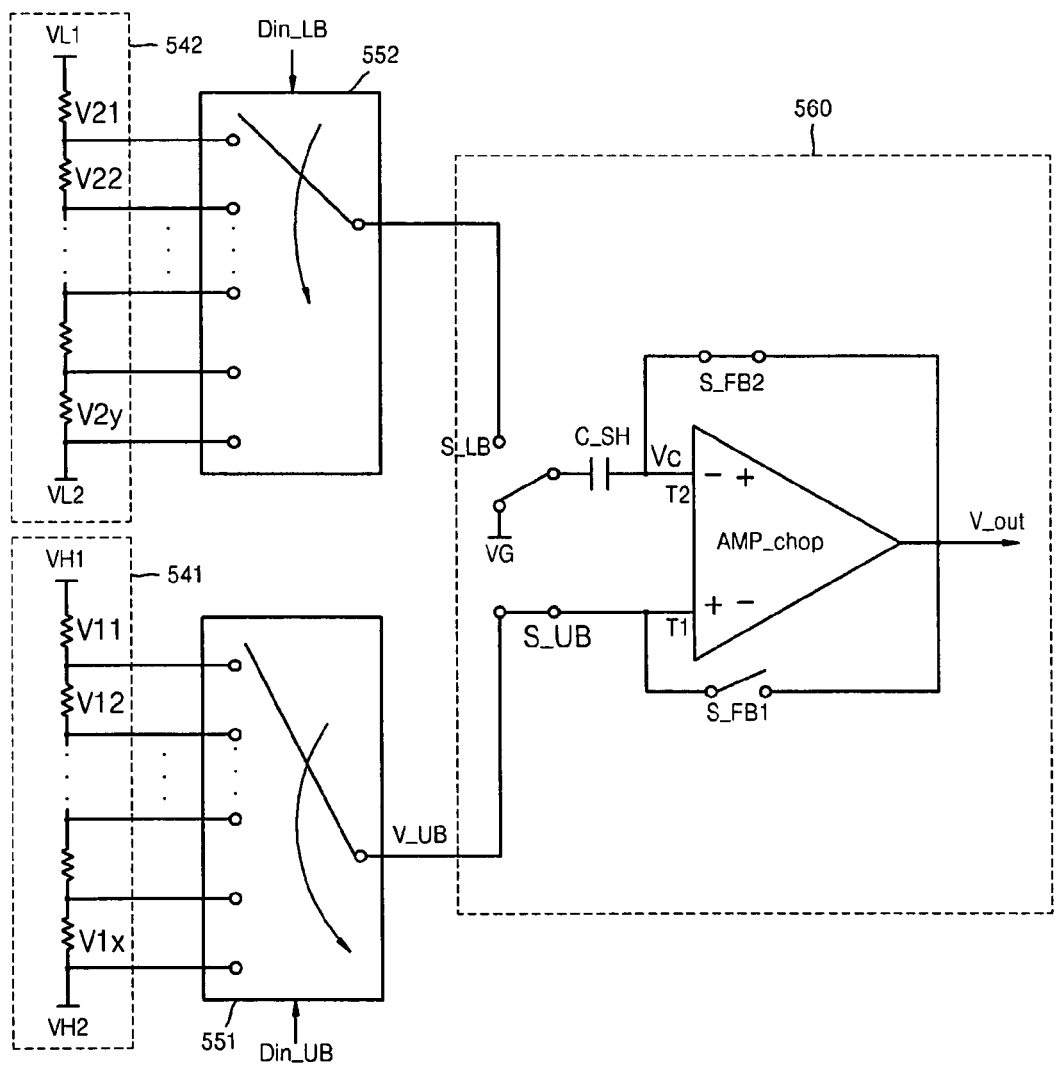
FIG. 5B illustrates a DAC of FIG. 5A operating in a non-inverting mode.
Figure 5C:
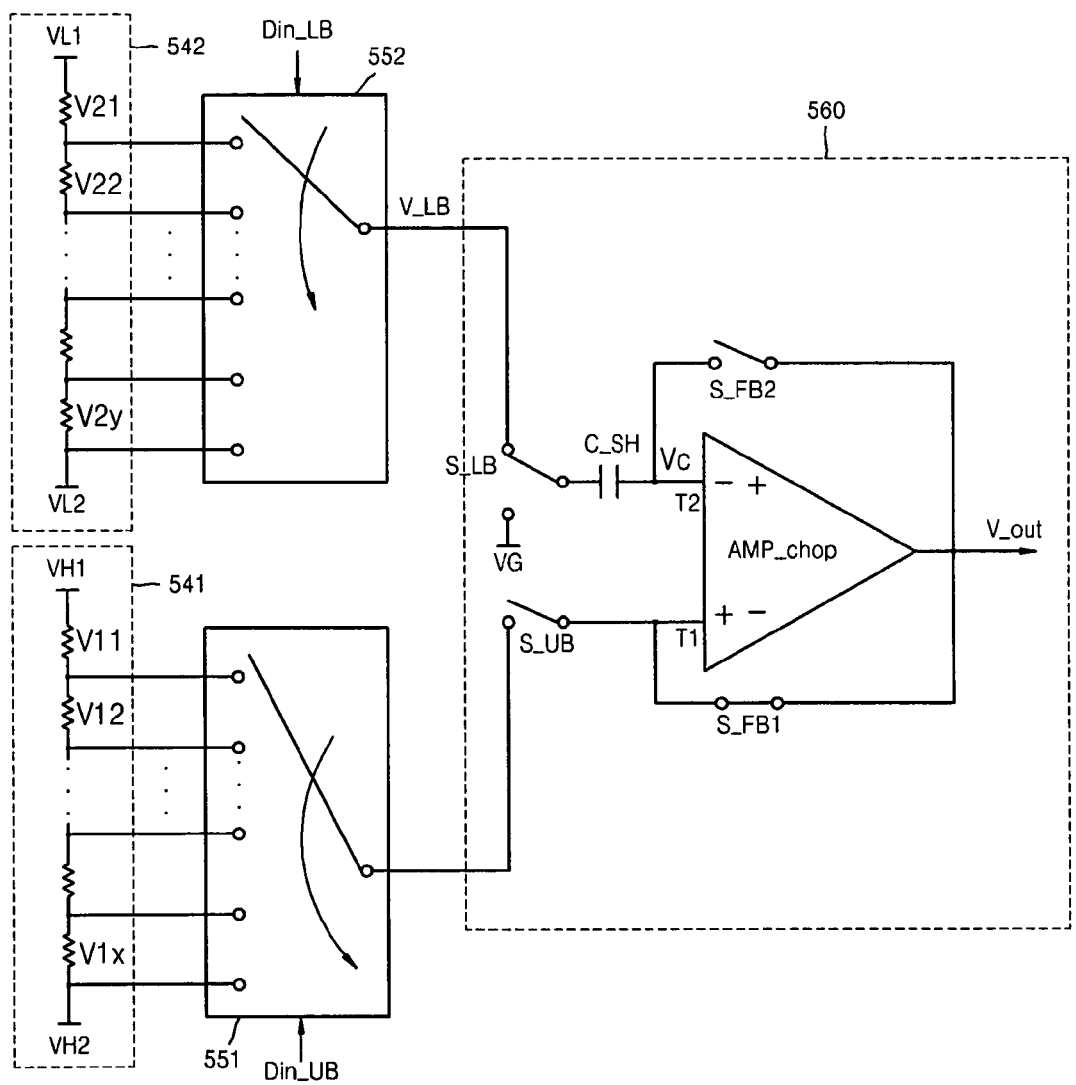
FIG. 5C illustrates a DAC of FIG. 5A operating in an inverting mode.

FIG. 5A illustrates a configuration of the DAC according to an example embodiment, FIG. 5B illustrates the DAC of FIG. 5A operating in a non-inverting mode, and FIG. 5C illustrates the DAC of FIG. 5A operates in an inverting mode. The DAC may include a high level voltage generator 541, a low level voltage generator 542, an upper bit decoder 551, a lower bit decoder 552, and the chopping amplification unit 560.

The high level voltage generator 541 may divide a voltage difference between the first high reference voltage VH1 and the second high reference voltage VH2 to generate the plurality of high level voltages V11, V12, . . . V1$x$. The low level voltage generator 542 may divide a voltage difference between the first low reference voltage VL1 and the second low reference voltage VL2 to generate low level voltages V21, V22 . . . V2$y$. The second high reference voltage VH2 may be equal to the second low reference voltage VL2. The second high reference voltage VH2 and the second low reference voltage VL2 may be set to a reference voltage VG. The high level voltage generator 541 may include a resistor string including x resistors, and the low level voltage generator 542 may include a resistor string including y resistors.

Digital data input to the DAC illustrated in FIGS. 5A, 5B, and 5C may be divided into upper x bits Din_UB and lower y bits Din_LB, and respectively applied to the upper bit decoder 551 and the lower bit decoder 552. When n-bit data is converted into an analog data voltage V_out, the DAC may divide the n-bit data into the upper x bits Din_UB and the lower y bits Din_LB, and may respectively decode the upper x bits Din_UB and the lower y bits Din_LB without using a level voltage generator having 2n resistors and a 2n-to-1 decoder in order to reduce the chip size.

In example embodiments, x+y=n (x, y, and n are natural numbers), and x=y=n/2. In another example embodiment, x≠y≠n/2. However, it should be appreciated that the example embodiments are not restricted to these relationships between, x, y and n.

The upper bit decoder 551 may output a high level voltage corresponding to the upper x bits Din_UB from among the plurality of high level voltages V11, V12, . . . , V1$x$ as an upper bit voltage V_UB. The lower bit decoder 552 may output a low level voltage corresponding to the lower y bits Din_LB from among the plurality of low level voltages V21, V22 . . . V2$y$ as a lower bit voltage V_LB.

The chopping amplification unit 560 may receive the upper bit voltage V_UB corresponding to the upper x bits Din_UB of the n-bit data and the lower bit voltage V_LB corresponding to the lower y bits Din_LB of the n-bit data, and may output the analog data voltage V_out. The chopping amplification unit 560 may include a sample and hold capacitor C_SH and a chopping amplifier AMP_chop. The chopping amplification unit 560 may also include an upper bit switch S_UB, a lower bit switch S_LB, a first feedback switch S_FB1, and a second feedback switch S_FB2 in order to control the operations of the sample and hold capacitor C_SH and the chopping amplifier AMP_chop.

The chopping amplifier AMP_chop may include a first input terminal T1, a second input terminal T2, and an output terminal outputting the analog data voltage V_out. The chopping amplifier AMP_chop may alternately operate in the non-inverting mode and the inverting mode during one line period.

Referring to FIG. 5B, in the non-inverting mode, the first input terminal T1 of the chopping amplifier AMP_chop may correspond to a positive terminal and the second input terminal T2 of the chopping amplifier AMP_chop may correspond to a negative terminal. In the non-inverting mode, the upper bit switch S_UB may be turned on, the lower bit switch S_LB may transfer the reference voltage VG, the first feedback switch S_FB1 may be turned off, and the second feedback switch S_FB2 may be turned on.

When the upper bit voltage V_UB is input to the first input terminal T1 of the chopping amplifier AMP_chop through the upper bit switch S_UB, the upper bit voltage V_UB may be supplied to a first terminal of the sample and hold capacitor C_SH connected to the second input terminal T2 of the chopping amplifier AMP_chop according to a virtual short-circuiting characteristic of the chopping amplifier AMP_chop.

In the non-inverting mode, the first terminal of the sample and hold capacitor C_SH may be provided with the upper bit voltage V_UB, and a second terminal of the sample and hold capacitor C_SH may be provided with the reference voltage VG, and thus, the sample and hold capacitor C_SH may be charged with the upper bit voltage V_UB. The voltage of the second terminal of the sample and hold capacitor C_SH may correspond to the reference voltage VG, and the voltage Vc of the first terminal of the sample and hold capacitor C_SH may correspond to the upper bit voltage V_UB.

Further, in the non-inverting mode, the upper bit voltage V_UB may be fed back through the second feedback switch S_FB2. Also, the second feedback switch S_FB2 may connect the second input terminal T2 of the chopping amplifier AMP_chop to the output terminal of the chopping amplifier AMP_chop, so that the voltage corresponding to the upper bit voltage V_UB may be output as the analog data voltage V_out.

In addition, the chopping amplifier AMP_chop may be an operational amplifier (OP-AMP). In the OP-AMP, there may be a virtual-short characteristic between two input terminals of the OP-AMP. Accordingly, a voltage of the second input terminal T2 of the chopping amplifier AMP_chop may be substantially equal to a voltage of the first input terminal T1 of the chopping amplifier AMP_chop. Therefore, the upper bit voltage V_UB may be transferred to the second feedback switch S_FB2, as illustrated in FIG. 5B.

Referring to FIG. 5C, in the inverting mode, the first input terminal T1 of the chopping amplifier AMP_chop may correspond to a negative terminal, and the second input terminal T2 of the chopping amplifier AMP_chop may correspond to a positive terminal. In the inverting mode, the upper bit switch S_UB may be turned off, the lower bit switch S_LB may transfer the lower bit voltage V_LB, the first feedback switch S_FB1 may be turned on, and the second feedback switch S_FB2 may be turned off.

When the lower bit voltage V_LB is input to the second terminal of the sample and hold capacitor C_SH through the lower bit switch S_LB, voltage boosting may occur in the sample and hold capacitor C_SH charged with the upper bit voltage V_UB. Accordingly, the voltage Vc of the first terminal of the sample and hold capacitor C_SH may become the sum of the upper bit voltage V_UB and the lower bit voltage V_LB.

In the inverting mode, the voltage of the second terminal of the sample and hold capacitor C_SH may correspond to the lower bit voltage V_LB, and the voltage Vc of the first terminal of the sample and hold capacitor C_SH may correspond to the sum of the upper bit voltage V_UB and the lower bit voltage V_LB.

Further, in the inverting mode, the first feedback switch S_FB1 may connect the first input terminal T1 of the chopping amplifier AMP_chop to the output terminal of the chopping amplifier AMP_chop, and thus, the voltage corresponding to the sum of the upper bit voltage V_UB and the lower bit voltage V_LB may be output as the analog data voltage V_out.

The chopping amplification 560 may output the upper bit voltage V_UB in the non-inverting mode, and may output the voltage corresponding to the sum of the upper bit voltage V_UB and the lower bit voltage V_LB in the inverting mode.

Figure 6:
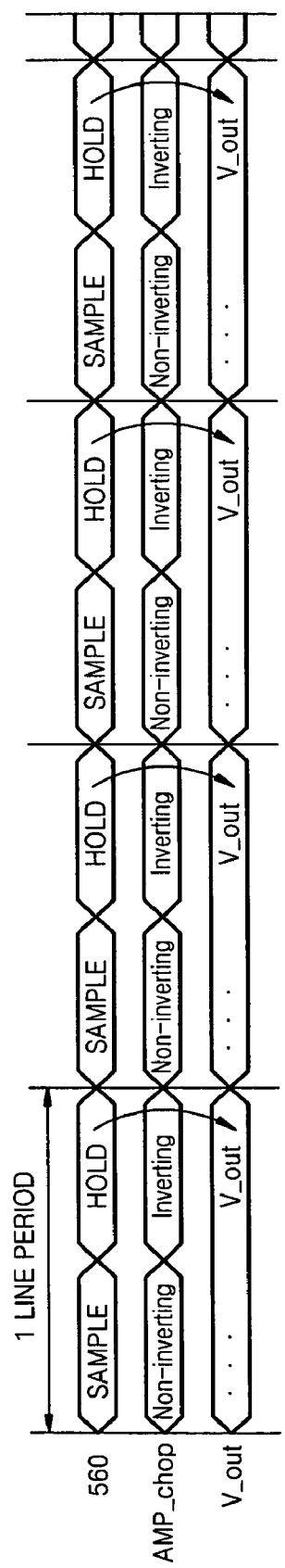
FIG. 6 illustrates a timing diagram of the operation of the DAC of FIG. 5A.

FIG. 6 illustrates a timing diagram of operating the DAC of FIG. 5A. The chopping amplification unit 560 of the DAC may alternately operate in the sample mode and the hold mode. The chopping amplifier AMP_chop may alternately operate in the non-inverting mode and the inverting mode during one line period. The chopping amplification unit 560 may output a voltage corresponding to the sum of the upper bit voltage V_UB and the lower bit voltage V_LB as the analog data voltage V_out in the hold mode of one line period.

Accordingly, the chopping amplification unit 560 of the DAC according to example embodiments may alternately operate in the non-inverting mode and the inverting mode, unlike a conventional amplifier, which may be characterized by offsets. As a result, example embodiments may remove the offset of the chopping amplifier when the analog data voltage is output.

Further, the DAC according to example embodiments may be applied to a display panel driver, e.g., the source driver 120, as illustrated in FIG. 1, and included in a display device. In this example embodiment, one line period (e.g., a period of scanning one gate line of a display panel) of a scanning operation for a display panel 110 may be divided into a non-inverting period and an inverting period. That is, one line period of the scanning operation may include a first period in which the DAC may operate in the non-inverting mode and a second period in which the DAC may operate in the inverting mode.

According to another example embodiment, there may also be a method that converts n-bit data into an analog data voltage using a sample and hold capacitor and a chopping amplifier alternately operating in the non-inverting mode and the inverting mode.

In the digital-to-analog conversion method, an upper bit voltage corresponding to upper x bits of the n-bit data and lower bit voltage corresponding to lower y bits of the n-bit data may be generated. The upper bit voltage may be a high level voltage corresponding to the upper x bits of the n-bit data from among a plurality of high level voltages generated by dividing a voltage difference between a first high reference voltage and a second high reference voltage. The lower bit voltage may be a low level voltage corresponding to the lower y bits of the n-bit data from among a plurality low level voltages generated by dividing a voltage difference between a first low reference voltage and a second low reference voltage.

In the non-inverting mode, the upper bit voltage may be input to a first input terminal of the chopping amplifier to charge the sample and hold capacitor having a first terminal connected to a second input terminal of the chopping amplifier with the upper bit voltage. Further, in the non-inverting mode, the voltage of a second terminal of the sample and hold capacitor may correspond to a reference voltage and the first terminal of the sample and hold capacitor may correspond to the upper bit voltage.

In the inverting mode, the lower bit voltage may be applied to the second terminal of the sample and hold capacitor and an output terminal of the chopping amplifier may be connected to the first input terminal of the chopping amplifier so as to output the voltage corresponding to the sum of the upper bit voltage and the lower bit voltage as the analog data voltage. Further, in the inverting mode, the voltage of the second terminal of the sample and hold capacitor may correspond to the lower bit voltage and the first terminal of the sample and hold capacitor may correspond to the sum of the upper bit voltage and the lower bit voltage.

Accordingly, example embodiments provide a chopping amplification unit of a DAC operating in both a sample mode and a hold mode during one line period, i.e., the DAC may employ a single chopping amplification unit, so that a chip size may be smaller than a DAC having two amplifiers.

Further, the DAC according to example embodiments may consume less power due to the DAC using only a single chopping amplifier.

Further, an offset of a chopping amplifier may be removed when the analog data voltage is output because the chopping amplifier may alternately operate in a non-inverting mode and an inverting mode.

In the figures, the dimensions of layers and regions may be exaggerated for clarity of illustration. It will also be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" or "above" another layer, it can be directly under or directly above, and one or more intervening layers may also be present. In addition, it will also be understood that when a layer is referred to as being "between" two layers, it can be the only layer between the two layers, or one or more intervening layers may also be present. Like numbers refer to like elements throughout. As used herein, the term "and/or" includes any and all combinations of one or more of the associated listed items.

It will also be understood that, although the terms "first" and "second" etc. may be used herein to describe various elements, structures, components, regions, layers and/or sections, these elements, structures, components, regions, layers and/or sections should not be limited by these terms. These terms are only used to distinguish one element, structure, component, region, layer and/or section from another element, structure, component, region, layer and/or section.

Thus, a first element, structure, component, region, layer or section discussed below could be termed a second element, structure, component, region, layer or section without departing from the teachings of example embodiments.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A digital-to-analog converter outputting an analog data voltage corresponding to n-bit data, comprising:
   a chopping amplification unit adapted to receive an upper bit voltage corresponding to upper x bits of the n-bit data and a lower bit voltage corresponding to lower y bits of the n-bit data and outputting the analog data voltage,
   wherein the chopping amplification unit includes:
       a sample and hold capacitor adapted to be charged with the upper bit voltage in a non-inverting mode; and
       a chopping amplifier adapted to supply the upper bit voltage to the sample and hold capacitor in the non-inverting mode and adapted to output a voltage corresponding to a sum of the upper bit voltage and the lower bit voltage as the analog data voltage in an inverting mode.

2. The digital-to-analog converter as claimed in claim 1, wherein the chopping amplifier includes:
   a first input terminal adapted to receive the upper bit voltage in the non-inverting mode;
   a second input terminal connected to a first terminal of the sample and hold capacitor; and
   an output terminal adapted to output the analog data voltage in the inverting mode.

3. The digital-to-analog converter as claimed in claim 2, wherein in the non-inverting mode, the first input terminal is a positive terminal and the second input terminal is a negative terminal, and in the inverting mode, the first input terminal is a negative terminal and the second input terminal is a positive terminal.

4. The digital-to-analog converter as claimed in claim 3, wherein the chopping amplifier alternately operates in the non-inverting mode and the inverting mode.

5. The digital-to-analog converter as claimed in claim 2, further comprising:
   an upper bit switch adapted to transfer the upper bit voltage to the first input terminal of the chopping amplifier when turned on;
   a lower bit switch adapted to transfer the lower bit voltage or a reference voltage to a second terminal of the sample and hold capacitor;
   a first feedback switch adapted to connect the first input terminal to the output terminal of the chopping amplifier; and
   a second feedback switch adapted to connect the second input terminal to the output terminal of the chopping amplifier.

6. The digital-to-analog converter as claimed in claim 5, wherein the upper bit switch is turned on in the non-inverting mode and turned off in the inverting mode.

7. The digital-to-analog converter as claimed in claim 5, wherein the lower bit switch is adapted to transfer the reference voltage in the non-inverting mode and adapted to transfer the lower bit voltage in the inverting mode.

8. The digital-to-analog converter as claimed in claim 5, wherein the first feedback switch is turned off in the non-inverting mode and turned on in the inverting mode.

9. The digital-to-analog converter as claimed in claim 5, wherein the second feedback switch is turned on in the non-inverting mode and turned off in the inverting mode.

10. The digital-to-analog converter as claimed in claim 5, wherein in the inverting mode, the second terminal of the sample and hold capacitor is adapted to have a voltage corresponding to the lower bit voltage, and the first terminal of the sample and hold capacitor is adapted to have a voltage corresponding to the sum of the upper bit voltage and the lower bit voltage.

11. The digital-to-analog converter as claimed in claim 1, further including:
   an upper bit decoder adapted to output a high level voltage corresponding to the upper x bits among a plurality of high level voltages input thereto as the upper bit voltage; and
   a lower bit decoder adapted to output a low level voltage corresponding to the lower y bits among a plurality of low level voltages input thereto as the low bit voltage.

12. The digital-to-analog converter as claimed in claim 11, wherein x+y=n, where x, y and n are natural numbers.

13. The digital-to-analog converter as claimed in claim 11, further comprising:
   a high level voltage generator adapted to divide a voltage difference between a first high reference voltage and a second high reference voltage to generate the plurality of high level voltages; and
   a low level voltage generator adapted to divide a voltage difference between a first low reference voltage and a second low reference voltage to generate the plurality of low level voltages.

14. The digital-to-analog converter as claimed in claim 13, wherein the high level voltage generator includes a resistor string including x resistors, and the low level voltage generator includes a resistor string including y resistors.

15. The digital-to-analog converter as claimed in claim 13, wherein the second high reference voltage is equal to the second low reference voltage.

16. A display panel driver comprising the digital-to-analog converter according to claim 1, wherein one line period of a display panel scanning operation is divided into a non-inverting mode period and an inverting mode period.

17. The display panel driver as claimed in claim 16, wherein the one line period of the display panel scanning operation includes a first period in which the display panel driver is adapted to operate in the non-inverting mode, and a second period in which the display panel driver is adapted to operate in the inverting mode.

18. A digital-to-analog converting method for converting n-bit data into an analog data voltage, comprising:
   providing a sample and hold capacitor and a chopping amplifier alternately operating in a non-inverting mode and an inverting mode;
   generating an upper bit voltage corresponding to upper x bits of the n-bit data and a lower bit voltage corresponding to lower y bits of the n-bit data;
   receiving the upper bit voltage through a first input terminal of the chopping amplifier and charging the sample and hold capacitor having a first terminal connected to a second input terminal of the chopping amplifier with the upper bit voltage in the non-inverting mode; and supplying the lower bit voltage to a second terminal of the sample and hold capacitor and connecting an output terminal of the chopping amplifier to the first input terminal of the chopping amplifier to output a voltage corresponding to the sum of the upper bit voltage and the lower bit voltage as the analog data voltage in the inverting mode.

19. The digital-to-analog converting method as claimed in claim 18, wherein in the non-inverting mode, the voltage of the second terminal of the sample and hold capacitor corresponds to a reference voltage, and the voltage of the first terminal of the sample and hold capacitor corresponds to the upper bit voltage in the non-inverting mode.

20. The digital-to-analog converting method as claimed in claim 18, wherein in the inverting mode, the voltage of the second terminal of the sample and hold capacitor corresponds to the lower bit voltage, and the voltage of the first terminal of the sample and hold capacitor corresponds to the sum of the upper bit voltage and the lower bit voltage in the inverting mode.

21. The digital-to-analog converting method as claimed in claim 18, wherein the offset of the chopping amplifier is removed by alternately operating the chopping amplifier in the non-inverting mode and the inverting mode.

22. The digital-to-analog converting method as claimed in claim 18, wherein the upper bit voltage is a high level voltage corresponding to the upper x bits among a plurality of high level voltages generated by dividing a voltage difference between a first high reference voltage and a second high reference voltage.

23. The digital-to-analog converting method as claimed in claim 18, wherein the lower bit voltage is a low level voltage corresponding to the lower y bits among a plurality of low level voltages generated by dividing a voltage difference between a first low reference voltage and a second low reference voltage.

* * * * *